(12) United States Patent
Lee et al.

(10) Patent No.: US 11,215,872 B2
(45) Date of Patent: Jan. 4, 2022

(54) ELECTRONIC APPARATUS INCLUDING LIGHT SOURCE UNIT AND METHOD OF FABRICATING THE SAME

(71) Applicant: Samsung Display Co., Ltd., Yongin-Si (KR)

(72) Inventors: Bum Lee, Seoul (KR); TaeGyun Kim, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 3 days.

(21) Appl. No.: 16/915,078

(22) Filed: Jun. 29, 2020

(65) Prior Publication Data

US 2021/0018796 A1    Jan. 21, 2021

(30) Foreign Application Priority Data

Jul. 16, 2019   (KR) .......................... 10-2019-0085746

(51) Int. Cl.
*G02F 1/13357*   (2006.01)
*G02F 1/1368*    (2006.01)
*G02F 1/1335*    (2006.01)
*G02F 1/1362*    (2006.01)

(52) U.S. Cl.
CPC ...... *G02F 1/133605* (2013.01); *G02F 1/1368* (2013.01); *G02F 1/133528* (2013.01); *G02F 1/133603* (2013.01); *G02F 1/133606* (2013.01); *G02F 1/133614* (2021.01); *G02F 1/136222* (2021.01); *G02F 2202/36* (2013.01)

(58) Field of Classification Search
CPC ......... G02F 1/133603; G02F 1/133606; G02F 1/133614; G02F 2202/36
See application file for complete search history.

(56) References Cited

U.S. PATENT DOCUMENTS

| 2019/0198730 | A1  | 6/2019  | Pickett et al. |
| 2019/0312181 | A1* | 10/2019 | Song ..................... G02B 6/0026 |
| 2020/0110312 | A1* | 4/2020  | Park ................... G02F 1/133617 |
| 2020/0183227 | A1* | 6/2020  | Lee ..................... G02F 1/133603 |
| 2020/0286872 | A1* | 9/2020  | Choi ...................... H01L 25/167 |

FOREIGN PATENT DOCUMENTS

| KR | 101779606 B1    | 10/2017 |
| KR | 1020170116735 A | 10/2017 |
| KR | 1020180071045 A | 6/2018  |
| KR | 1020180072798 A | 6/2018  |
| KR | 1020180130765 A | 12/2018 |
| KR | 1020210003330 A | 1/2021  |

\* cited by examiner

*Primary Examiner* — Jia X Pan
(74) *Attorney, Agent, or Firm* — Cantor Colburn LLP

(57) ABSTRACT

A light source unit includes a plate including a front surface and a rear surface opposite to the front surface, a light scattering section on the front surface of the plate, a light controlling section on the light scattering section and including a plurality of quantum dots, a light source on the rear surface of the plate and including a light emitting element which generates light, a light emitting surface from which the light is emitted, and a plurality of lead frames connected to the light emitting element. The light source provides light from the rear surface of the plate toward the light controlling section. The light emitting surface of the light source is in contact with the rear surface of the plate.

20 Claims, 16 Drawing Sheets

ELECTRONIC APPARATUS INCLUDING LIGHT SOURCE UNIT AND METHOD OF FABRICATING THE SAME

This application claims priority to Korean Patent Application No. 10-2019-0085746, filed on Jul. 16, 2019, and all the benefits accruing therefrom under 35 U.S.C. § 119, the content of which in its entirety is herein incorporated by reference.

BACKGROUND

1. Field

Embodiments of the invention relate to an electronic apparatus including a light source unit and a method of fabricating the electronic apparatus, and more particularly, to a small-sized electronic apparatus and a method of fabricating the small-sized electronic apparatus.

2. Description of the Related Art

Various types of electronic apparatus have been used to display image information, and a liquid crystal display device is being widely used for large-sized display devices, portable display devices, etc., due to desired characteristics thereof, such as low power consumption. In such a liquid crystal display device, various kinds of optical members are included to a light source unit thereof to increase an optical efficiency and color reproduction properties.

SUMMARY

Recently, an electronic apparatus having small thickness and high optical characteristics is increasingly demanded, but when various optical members are included therein to improve display quality, the total thickness of the display device may be increased.

Embodiments of the invention provide an electronic apparatus having a small size or thickness with improved optical characteristics.

According to an embodiment of the invention, a light source unit includes: a plate including a front surface and a rear surface opposite to the front surface; a light scattering section on the front surface of the plate; a light controlling section on the light scattering section, where the light controlling section includes a plurality of quantum dots; a light source on the rear surface of the plate, where the light source includes a light emitting element which generates light, a light emitting surface from which the light is emitted, and a plurality of lead frames connected to the light emitting element. In such an embodiment, the light source provides light from the rear surface of the plate toward the light controlling section, and the light emitting surface of the light source is in contact with the rear surface of the plate.

In an embodiment, the plate may include: a base layer including a top surface, on which the light scattering section is disposed, and a bottom surface opposite to the top surface; a plurality of conductive lines on the bottom surface of the base layer; and a window dielectric layer which covers the bottom surface of the base layer, where a plurality of contact holes may be defined through the window dielectric layer to expose portions of the conductive lines. In such an embodiment, each of the lead frames may be connected to a corresponding one of the conductive lines.

In an embodiment, the light source unit may further comprise a plurality of conductive pastes on the window dielectric layer, where the conductive pastes may overlap the contact holes, respectively. In such an embodiment, the lead frames may be connected to the conductive lines through the conductive pastes.

In an embodiment, the base layer may include a line groove patterned on the bottom surface of the base layer in a thickness direction of the plate. In such an embodiment, the conductive lines may be disposed in the line groove.

In an embodiment, the light source may be provided in plural. In such an embodiment, the light scattering section may include a plurality of scattering patterns which overlaps the plurality of light sources, respectively, when viewed in a plan view. In such an embodiment, the light controlling section may further include a plurality of controlling patterns which overlaps the scattering patterns, respectively, when viewed in the plan view.

In an embodiment, a width of each of the controlling patterns may be greater than a maximum width of light irradiated to the front surface of the plate from a corresponding one of the light sources.

In an embodiment, the light provided from the light source toward the light controlling section may be a blue light.

In an embodiment, the quantum dots of the light controlling section may convert the light provided from the light source into one of a red light and a green light. In such an embodiment, the light source unit may further include a light reflecting section spaced apart from the rear surface of the plate over the light source.

According to an embodiment of the invention, an electronic apparatus includes: a light source unit; a display unit on the light source unit; and an optical sheet between the display unit and the light source unit. In such an embodiment, the light source unit includes a plate including a front surface and a rear surface opposite to the front surface, a light scattering section on the front surface of the plate, a light controlling section on the light scattering section, and a light source on the rear surface of the plate, where the light controlling section includes a plurality of quantum dots, and the display unit includes a first substrate, a second substrate opposite to the first substrate, and a liquid crystal layer between the first substrate and the second substrate. In such an embodiment, the light source provides the display unit with light and contacts the rear surface of the plate.

In an embodiment, the plate may include: a base layer including a top surface, on which the light scattering section is disposed, and a bottom surface opposite to the top surface; a plurality of conductive lines on the bottom surface of the base layer; and a window dielectric layer which covers the bottom surface of the base layer, where a plurality of contact holes may be defined through the window dielectric layer to expose portions of the conductive lines.

In an embodiment, the light source may include a light emitting element which generates light and a plurality of lead frames connected to the light emitting element. In such an embodiment, each of the lead frames may be connected to a corresponding one of the conductive lines.

In an embodiment, the light source unit may further include a plurality of conductive pastes on the window dielectric layer, where the conductive pastes may overlap the contact holes. In such an embodiment, the lead frames may be connected to the conductive lines through the conductive pastes.

In an embodiment, the base layer may include a line groove patterned on the bottom surface of the base layer in a thickness direction of the plate. In such an embodiment, the conductive lines may be disposed in the line groove.

In an embodiment, the light source may be provided in plural. In such an embodiment, the light scattering section may include a plurality of scattering patterns which overlaps the plurality of light sources, respectively, when viewed in a plan view, and the light controlling section may further include a plurality of controlling patterns which overlaps the scattering patterns, respectively, when viewed in the plan view.

In an embodiment, a width of each of the controlling patterns may be greater than a maximum width of light irradiated to the front surface of the plate from a corresponding one of the light sources.

In an embodiment, the first substrate may include a first base substrate, a transistor on the first base substrate, a first electrode connected to the transistor, a color filter layer between the transistor and the first electrode, and a first polarizing layer below the first base substrate. In such an embodiment, the second substrate may include a second base substrate, a second electrode on the second base substrate, and a second polarizing layer on the second base substrate.

In an embodiment, the optical sheet may include at least one sheet selected from a diffusion sheet, a prism sheet, and a brightness enhancement sheet.

According to an embodiment of the invention, a method of fabricating a light source unit includes: providing a preliminary plate which includes a base layer including a top surface and a bottom surface opposite to each other, a light scattering section on the top surface of the base layer, and a light controlling section on the light scattering section; patterning the bottom surface of the base layer to form a line groove, where the bottom surface is patterned in a thickness direction of the base layer; providing a plurality of conductive lines in the line groove; providing a window dielectric layer on the conductive lines and forming a plurality of contact holes through the window dielectric layer to expose at least portions of the conductive lines; providing a plurality of conductive pastes which overlaps the contact holes, respectively; and providing a light source connected to the conductive lines through the conductive pastes. In such an embodiment, the light source is in contact with the window dielectric layer.

In an embodiment, the method may further include: heating the conductive pastes; and solidifying the conductive pastes which are in a molten state.

BRIEF DESCRIPTION OF THE DRAWINGS

The above and other features of the invention will become more apparent by describing in detail exemplary embodiments thereof with reference to the accompanying drawings, in which.

DETAILED DESCRIPTION

Figure 1:
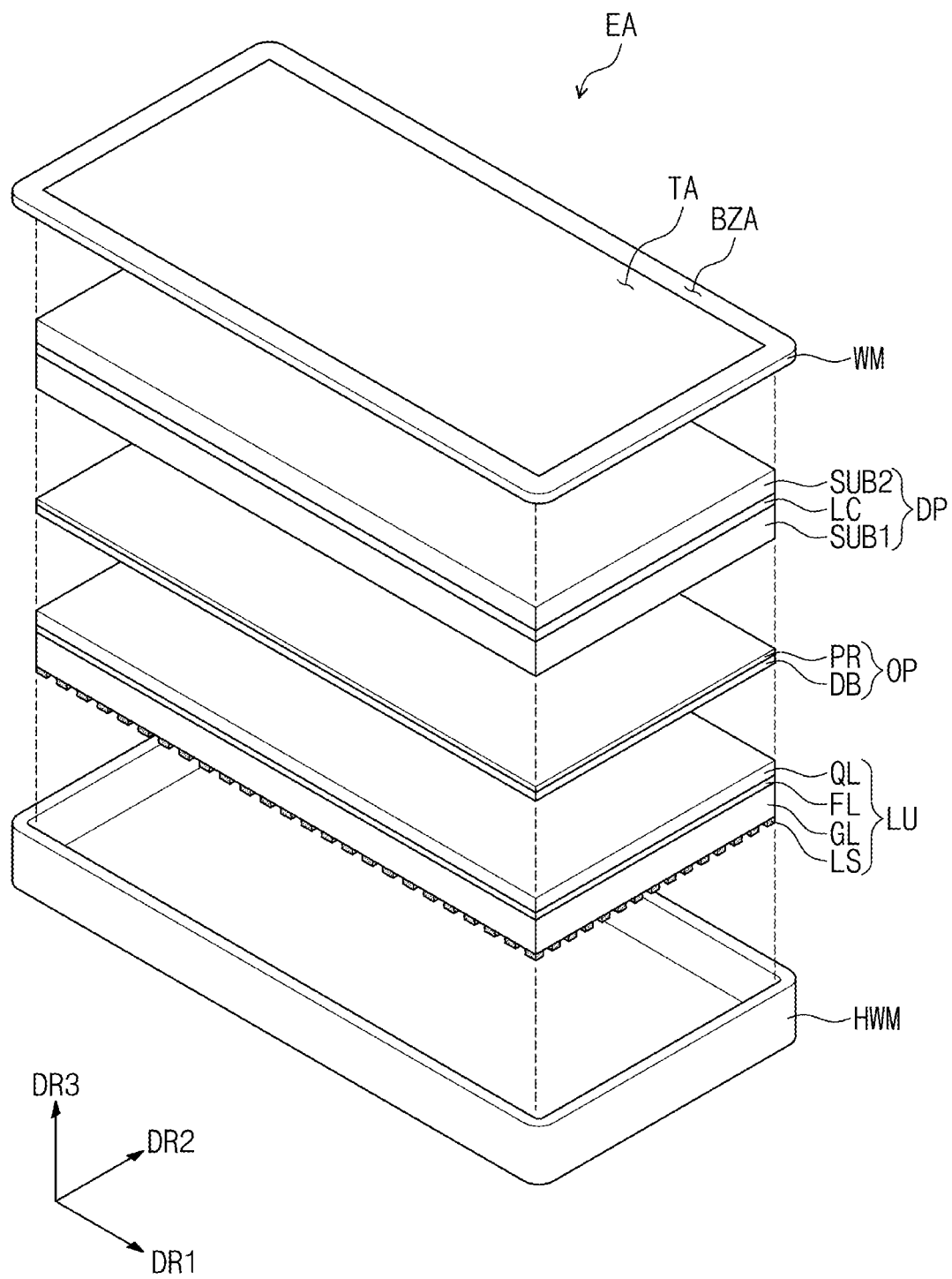
FIG. 1 illustrates an exploded perspective view showing an electronic apparatus according to an exemplary embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

In this description, when a certain component (or region, layer, portion, etc.) is referred to as being "on", "connected to", or "coupled to" other component(s), the certain component may be directly disposed on, directly connected to, or directly coupled to the other component(s) or at least one intervening component may be present therebetween. In contrast, when an element is referred to as being "directly on", "directly connected to", or "directly coupled to" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In addition, the terms "beneath", "lower", "above", "upper", and the like are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms used herein including technical and scientific terms have the same meaning generally understood by one of ordinary skilled in the art. Also, terms as defined in dictionaries generally used should be understood as having meaning identical or meaning contextually defined in the art and should not be understood as ideally or excessively formal meaning unless definitely defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described in detail with reference to the accompanying drawings.

Figure 2:
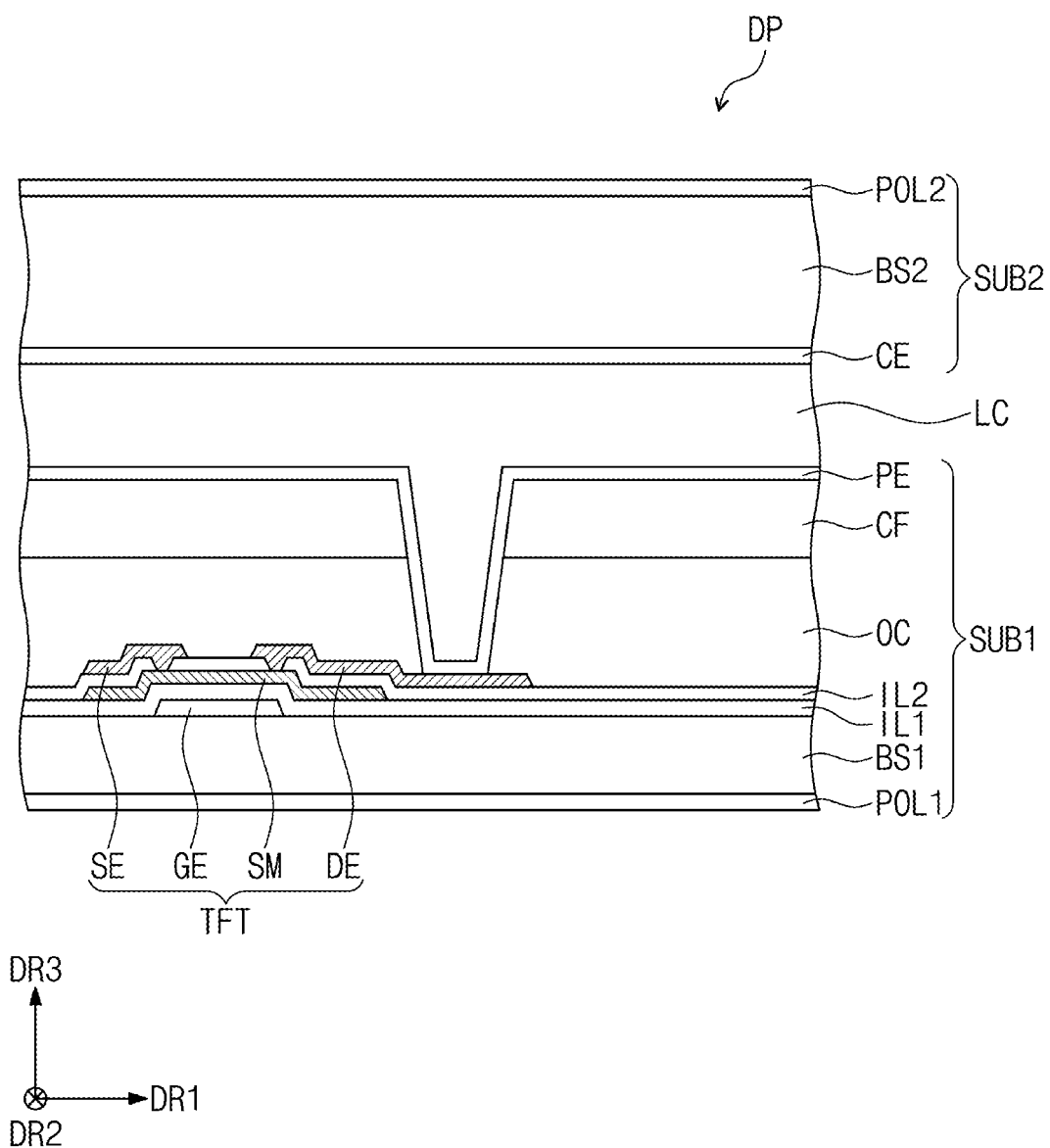
FIG. 2 illustrates a cross-sectional view showing a display unit according to an exemplary embodiment of the invention.
Figure 3:
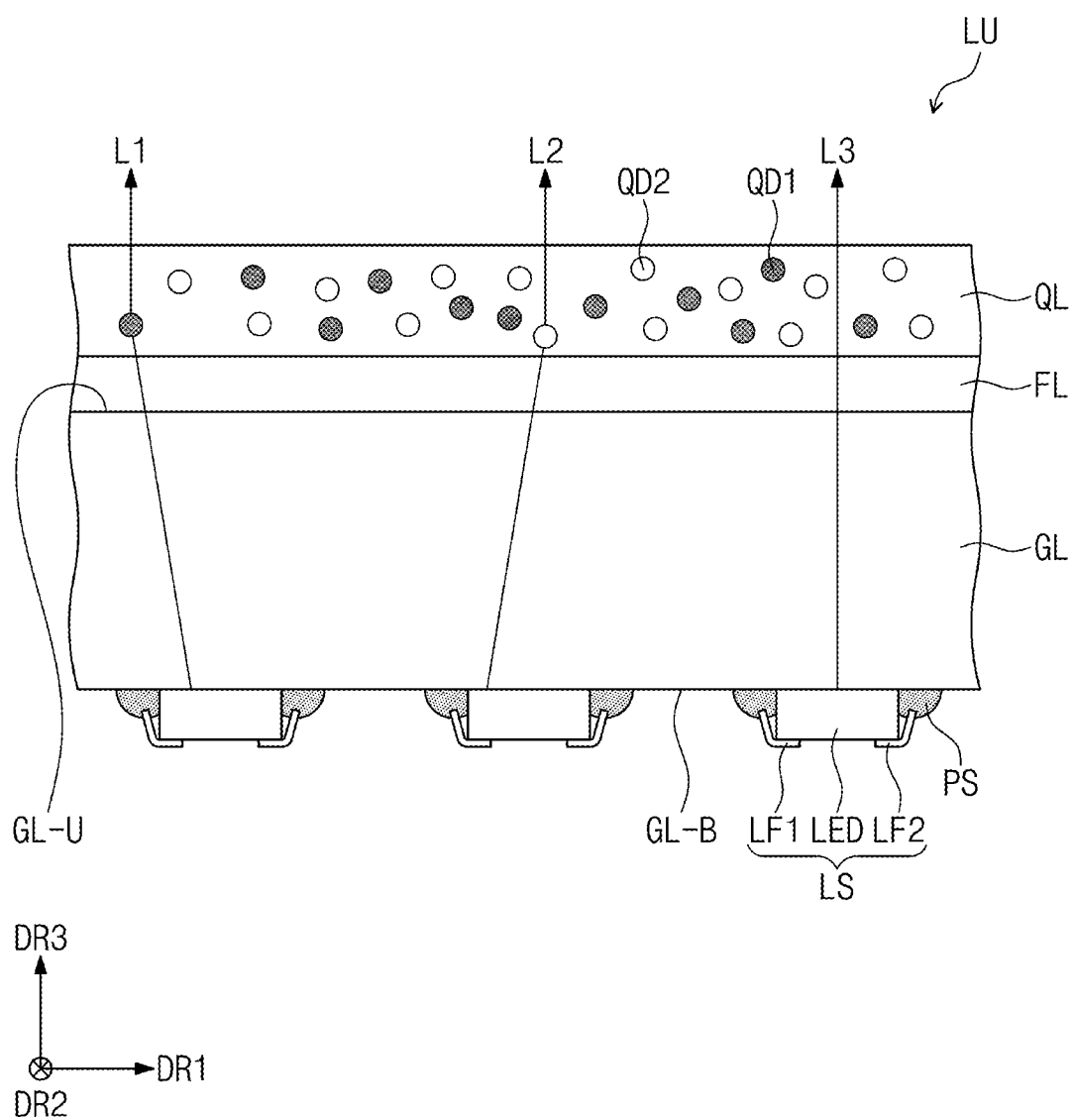
FIG. 3 illustrates a cross-sectional view showing a light source unit according to an exemplary embodiment of the invention.

FIG. 1 illustrates an exploded perspective view showing an electronic apparatus according to an exemplary embodiment of the invention. FIG. 2 illustrates a cross-sectional view showing a display unit according to an exemplary embodiment of the invention. FIG. 3 illustrates a cross-sectional view showing a light source unit according to an exemplary embodiment of the invention.

Referring to FIG. 1, an exemplary embodiment of an electronic apparatus EA includes a window member WM, a display unit DP, an optical sheet OP, a light source unit LU, and an accommodation member HWM. The electronic apparatus EA may include a display device, which provides an image. In one exemplary embodiment, for example, the electronic apparatus EA may be a liquid crystal display device or an organic electroluminescence display device.

In the drawings, first, second and third directional axes DR1, DR2 and DR3, which are relative concepts, are illustrated, and the third directional axis DR3 may be defined to indicate a direction along which an image is provided to users. In the drawings, the first directional axis DR1 (also referred to herein as a first direction) and the second directional axis DR2 (also referred to herein as a second direction) may be perpendicular to each other, and the third directional axis DR3 (also referred to herein as a third direction) may be a normal direction to a plane defined by the first direction DR1 and the second direction DR2. In FIG. 1, a plane defined by the first direction DR1 and the second direction DR2 may be a display surface on which an image is provided, and the third direction DR3 may be a thickness direction of the display unit DP.

The window member WM is disposed on the display unit DP. The window member WM may include or be formed of a material including a glass, sapphire, or a plastic. The window member WM includes a light transmitting area TA through which an image from the display unit DP is displayed and a light shielding area BZA through which no image is displayed.

When viewed from a plan view in the third direction DR3, the light transmitting area TA may be disposed on a central portion of the electronic apparatus EA. The light shielding area BZA may be disposed around the light transmitting area TA and may have a frame shape that surrounds the light transmitting area TA. The invention, however, are not limited thereto. In an alternative exemplary embodiment, the window member WM may include only the light transmitting area TA, and in such an embodiment, the light shielding area BZA may be omitted. Alternatively, the light shielding area BZA may be disposed on at least one side of the light transmitting area TA. Alternatively, the window member WM may be omitted from the electronic apparatus EA.

Referring to FIG. 2, an exemplary embodiment of the display unit DP may include a first substrate SUB1, a second substrate SUB2, and a liquid crystal layer LC. The liquid crystal layer LC is disposed between the first substrate SUB1 and the second substrate SUB2.

The first substrate SUB1 may include a first base substrate BS1, a transistor TFT, a planarization layer OC, a color filter layer CF, a first electrode PE, a plurality of dielectric layers IL1 and IL2, and a first polarizing layer POL1.

The second substrate SUB2 may include a second base substrate BS2, a second electrode CE, and a second polarizing layer POL2.

The first base substrate BS1 may be provided as a base layer on which components of the first substrate SUB1 are dispose or formed, e.g., deposited and/or patterned. Each of the first and second base substrates BS1 and BS2 may be a transparent dielectric substrate. In one exemplary embodiment, for example, each of the first and second base substrates BS1 and BS2 may be a glass substrate or a plastic substrate. Alternatively, each of the first and second base substrates BS1 and BS2 may be a metal substrate, but the invention is not limited thereto. The first and second base substrates BS1 and BS2 may be disposed opposite to each other.

The display unit DP includes a pixel that displays an image. The pixel may be provided in plural, and the plurality of pixels may be arranged in a matrix shape on a plane defined by the first direction DR1 and the second direction DR2.

The pixel is disposed between the first base substrate BS1 and the second base substrate BS2. The pixel includes the transistor TFT and a liquid crystal capacitor PE, LC, and CE. The transistor TFT includes a control electrode GE, an input electrode SE, an output electrode DE, and a semiconductor pattern SM. The liquid crystal capacitor PE, LC, and CE includes the first electrode PE connected to the transistor TFT, the second electrode CE opposite to the first electrode PE, and a dielectric layer between the first electrode PE and the second electrode CE. In an exemplary embodiment, the dielectric layer corresponds to the liquid crystal layer LC.

Each of the pixels is connected to corresponding signal lines of a plurality of signal lines. The signal lines include a plurality of gate lines and a plurality of data lines. The plurality of gate lines are arranged in one direction on the display unit DP. The plurality of data lines are insulated from and intersect the plurality of gate lines.

The control electrode GE is disposed on the first base substrate BS1. The control electrode GE may be branched from the gate line. The control electrode GE includes a conductive material. In one exemplary embodiment, for example, the control electrode GE may include at least one selected from a metal oxide and a metal, such as nickel (Ni), molybdenum (Mo), aluminum (Al), titanium (Ti), copper (Cu), and tungsten (W). The control electrode GE have a single layer structure or a multi-layer structure. The gate line include or is formed of a same material as and has a same layered structure as those of the control electrode GE.

The first dielectric layer IL1 covers the control electrode GE and the first base substrate BS1. The first dielectric layer IL1 may include an inorganic material. In one exemplary embodiment, for example, the first dielectric layer IL1 may include at least one material selected from silicon oxide (SiOx), silicon nitride (SiNx), and silicon oxynitride (SiON).

The semiconductor pattern SM is disposed on the first dielectric layer IL1. At least a portion of the semiconductor pattern SM overlaps the control electrode GE.

FIG. 2 shows an exemplary embodiment where the transistor TFT is a bottom gate type transistor, but the invention is not limited thereto. In one alternative exemplary embodiment, for example, the transistor TFT may be a top gate type transistor, in which a control electrode is disposed on input and output electrodes, but not being limited thereto.

The input electrode SE and the output electrode DE are disposed on the first dielectric layer IL1. One side of the input electrode SE is connected to a corresponding data line, and other side of the input electrode SE overlaps the semiconductor pattern SM. One side of the output electrode DE overlaps the semiconductor pattern SM, and other side of the output electrode DE is connected to the second electrode CE. The other side of the input electrode SE and the one side of the output electrode DE are spaced apart from each other.

Each of the input and output electrodes SE and DE includes a conductive material. In one exemplary embodiment, for example, each of the input and output electrodes SE and DE may include at least one material selected from nickel (Ni), chromium (Cr), molybdenum (Mo), aluminum (Al), titanium (Ti), copper (Cu), tungsten (W), and a combination (e.g., an alloy) thereof. Each of the input and output electrodes SE and DE may have a single layer structure or a multi-layer structure. The data line includes or is formed of a same material as and has a same layered structure as those of the input electrode SE.

The second dielectric layer IL2 is disposed on the first dielectric layer IL1. The second dielectric layer IL2 covers the input and output electrodes SE and DE. The second dielectric layer IL2 may include a same material as that of the first dielectric layer IL1.

The planarization layer OC is disposed on the transistor TFT. The planarization layer OC is disposed on an inorganic layer placed on the transistor TFT and provides a planar top surface. The planarization layer OC may include an organic material.

The color filter layer CF may be disposed on the planarization layer OC. The color filter layer CF may include three or more filters, each of which transmits light of a wavelength range different from that of light that passes through other one of the filters. In one exemplary embodiment, for example, the color filter layer CF may include a red color filter, a green color filter, and a blue color filter, and optionally a white color filter, but the invention is not limited thereto. The filters, which transmit light having different wavelength ranges from each other, included in the color filter layer CF may be arranged in various orders or patterns.

Although not shown, a capping layer may be disposed on the color filter layer CF. The capping layer may include an inorganic material. In one exemplary embodiment, for example, the capping layer may include silicon nitride or silicon oxide.

FIG. 2 shows an exemplary embodiment having a color-filter-on-array ("COA") structure in which the display unit DP is provided or formed on a single substrate, on which the transistor TFT and the color filter layer CF are provided or formed. The invention, however, are not limited thereto. Alternatively, the display unit DP may be configured in a way such that the transistor TFT is included in the first substrate SUB1 and the color filter layer CF is included in the second substrate SUB2, but not being limited thereto.

The second electrode CE is disposed on the color filter layer CF. The second electrode CE is electrically connected to the output electrode DE through a contact hole defined through the color filter layer CF and the planarization layer OC. The second electrode CE is electrically connected to the output electrode DE and thereby receives voltage that corresponds to a data signal.

The second electrode CE may include a transparent conductive material. In one exemplary embodiment, for example, the second electrode CE may include a least one material selected from indium tin oxide, indium zinc oxide, indium gallium zinc oxide, fluorine zinc oxide, gallium zinc oxide, and tin oxide.

The first polarizing layer POL1 is disposed below the first base substrate BS1. The first polarizing layer POL1 is a coated polarizing layer, a polarizing layer formed by deposition, or is formed by coating a dichromatic dye and a liquid crystal compound. Alternatively, the first polarizing layer POL1 may be a wire grid type polarizing layer.

Although FIG. 2 shows an exemplary embodiment where the first polarizing layer POL1 is disposed below the first base substrate BS1, but not being limited thereto. Alternatively, the first polarizing layer POL1 may be an in-cell type polarizing layer disposed between the first base substrate BS1 and the liquid crystal layer LC, but the invention is not limited thereto.

The liquid crystal layer LC includes liquid crystal molecules having directionality. An arrangement of the liquid crystal molecules are changed in accordance with an electric field generated based on a difference in voltage between the first electrode PE and the second electrode CE. An amount of light that passes through the liquid crystal layer LC may be determined based on the arrangement of the liquid crystal molecules.

Although not shown, the display unit DP may further include a plurality of alignment layers disposed on and below the liquid crystal layer LC. One of the alignment layers is disposed between the liquid crystal layer LC and the first electrode PE and other one of the alignment layers is disposed between the liquid crystal layer LC and the second electrode CE, which results in orientation of the liquid crystal molecules. The alignment layers may include or be formed of vertical alignment layers and may include at least one material selected from polyamic acid, polysiloxane acid, polyimide, for example.

The second electrode CE is disposed on the liquid crystal layer LC. In such an embodiment, as described above, the second electrode CE, the liquid crystal layer LC, and the second electrode CE constitute the liquid crystal capacitor.

The second electrode CE may include a transparent conductive material. In one exemplary embodiment, for example, the second electrode CE may include at least one material selected from indium tin oxide, indium zinc oxide, indium gallium zinc oxide, fluorine zinc oxide, gallium zinc oxide, and tin oxide.

The second polarizing layer POL2 is disposed on the second base substrate BS2. The second polarizing layer POL2 may be a coated polarizing layer or a polarizing layer formed by deposition. Alternatively, the second polarizing layer POL2 may be a film type polarizing member that is separately fabricated and provided on the second base substrate BS2.

Although FIG. 2 shows an exemplary embodiment where the second polarizing layer POL2 is disposed on the second base substrate BS2, but not being limited thereto. Alternatively, the display unit DP may be configured in a way such that the second polarizing layer POL2 is an in-cell type polarizing layer disposed below the second base substrate BS2.

Referring back to FIG. 1, the optical sheet OP is disposed between the display unit DP and the light source unit LU. The optical sheet OP may serve to reduce loss of light and to increase brightness of light when the light from the light source unit LU passes therethrough to the display unit DP. The optical sheet OP may include at least one sheet selected from a diffusion sheet (not shown), a prism sheet PR, and a brightness enhancement sheet DB.

The brightness enhancement sheet DB, such as a dual brightness enhancement film ("DBEF") commercially available from 3M Company, serves to reduce loss of light provided from the light source unit LU. The prism sheet PR serves to change side light into front light with respect to light that has passed through the brightness enhancement sheet DB and thereby to concentrate radiating light, which results in an increase in brightness.

Referring to FIG. 3, in an exemplary embodiment, the light source unit LU includes a plate GL, a light scattering section (or layer) FL, a light controlling section (or layer) QL, and a light source LS.

The light source unit LU is disposed below the optical sheet OP. The plate GL has a front surface GL-U that faces the display unit DP and a rear surface GL-B opposite to the front surface GL-U. The front surface GL-U of the plate GL may be a surface on which the light scattering section FL is disposed, and the rear surface GL-B of the plate GL may be a surface on which the light source LS is disposed.

The light scattering section FL is disposed on the front surface GL-U of the plate GL. The light scattering section FL may disperse light provided from the light source LS, thereby preventing a partial concentration of light. In an exemplary embodiment, the light scattering section FL may be formed by depositing a material, which includes at least one material selected from polyester and polycarbonate, on the front surface GL-U of the plate GL.

The light controlling section QL may be disposed on the light scattering section FL. The light controlling section QL may change a wavelength of light provided from the light source LS. In an exemplary embodiment, the light controlling section QL may include a plurality of quantum dots QD1 and QD2.

The quantum dots QD1 and QD2 may include at least one material selected from II-VI group compounds, III-V group compounds, IV-VI group compounds, IV group elements, IV group compounds, and a combination thereof.

The II-VI group compounds may include a binary compound selected from the group consisting of CdSe, CdTe, ZnS, ZnSe, ZnTe, ZnO, HgS, HgSe, HgTe, MgSe, MgS, and a combination, (e.g., a mixture) thereof; a ternary compound selected from the group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and a combination thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof.

The III-V group compounds may include a binary compound selected from the group consisting of GaN, GaP, GaAs, GaSb, AlN, AlP, AlAs, AlSb, InN, InP, InAs, InSb and a combination thereof; a ternary compound selected from the group consisting of GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP and a combination thereof and a quaternary compound selected from the group consisting of GaAlNAs, GaAlNSb, GaAl, GaAlPSb, GaInNP, GaInNAs, GaInNSb, GaInPAs, GaInPSb, InAlNP, InAlNAs, InAlNSb, InAlPAs, InAlPSb and a combination thereof.

The IV-VI group compounds may include a binary compound selected from the group consisting of SnS, SnSe, SnTe, PbS, PbSe, PbTe and a combination thereof a ternary compound selected from the group consisting of SnSeS, SnSeTe, SnSTe, PbSeS, PbSeTe, PbSTe, SnPbS, SnPbSe, SnPbTe and a combination thereof; and a quaternary compound selected from the group consisting of SnPbSSe, SnPbSeTe, SnPbSTe and a combination thereof. The IV group elements may be selected from the group consisting of Si, Ge, and a combination thereof. The IV group compounds may include a binary compound selected from the group consisting of SiC, SiGe and a combination thereof.

In an exemplary embodiment, one of the binary, ternary, and quaternary compounds may be present at a uniform concentration in a particle, or may be present to have divided states at partially different concentrations in a same particle. In an exemplary embodiment, the quantum dots QD1 and QD2 may have a core/shell structure in which one quantum dot surrounds another quantum. An interface between the core and the shell may have a concentration gradient such that concentration of an element present in the shell decreases as approaching a center of the core.

In an exemplary embodiment, the quantum dots QD1 and QD2 may have a core-shell structure in which a shell encloses a core including nano-crystal described above. The shell of the quantum dots QD1 and Q2 may serve as a protective layer which prevents chemical degeneration of the core to thereby maintain semiconductor characteristics and/or as a charging layer which provides the quantum dot with electrophoresis properties. The shell may be a single layer or a multiple layer. An interface between the core and the shell may have a concentration gradient such that concentration of an element present in the shell decreases as approaching a center of the core. The shell of the quantum dot may be, for example, metal oxide, non-metal oxide, a semiconductor compound, or a combination thereof.

The metal oxide or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, COO, $Co_3O_4$, and NiO, or a ternary compound such as $MgAl_2O_4$, $CoFe_2O_4$, $NiFe_2O_4$, or $CoMn_2O_4$, but the invention is not limited thereto.

The semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or a combination thereof, but the invention is not limited thereto.

The quantum dots QD1 and QD2 may have a full width of half maximum ("FWHM") of a light emitting wavelength spectrum, which FWHM falls within a range of about 45 nanometers (nm) or less, e.g. about 40 nm or less, or about 30 nm or less, and color purity and/or color reproduction may improve in this range. In addition, light released through such quantum dot may be emitted in all directions, which may result in an improvement in wide viewing angle.

The quantum dots QD1 and QD2 may have a shape generally used in the art, but the invention is not limited thereto. In one exemplary embodiment, for example, the quantum dots QD1 and QD2 may have a shape of sphere, pyramid, multi-arm, cubic nano-particle, nano-tube, nano-wire, nano-fiber, or nano-plate particle.

The quantum dots QD1 and QD2 may adjust a color of light emitted based on a particle size thereof, and thus may have various luminous colors such as blue, red, and green.

The light source LS includes a light emitting element LED and lead frames LF1 and LF2. The light emitting element LED may emit light in response to voltage provided from a circuit board (not shown). The light emitting element LED may have a structure in which an n-type semiconductor layer, an active layer, and a p-type semiconductor layer are sequentially stacked one on another, such that when a driving voltage is applied, electrons and holes may migrate and recombine with each other to generate light.

The lead frames LF1 and LF2 may be electrically connected to the light emitting element LED, thereby providing the light emitting element LED with voltage provided from a circuit board (not shown). In an exemplary embodiment, the light emitting element LED may provide a blue light.

The lead frames LF1 and LF2 may be coupled through conductive pastes PS to the rear surface GL-B of the plate GL. The conductive pastes PS may include a conductive material. In such an embodiment, voltage provided from a circuit board (not shown) may be provided to the light emitting element LED through the conductive pastes PS and the lead frames LF1 and LF2.

In an exemplary embodiment, light provided from the light emitting element LED may pass through the plate GL, and then may be provided to the display unit DP through the light scattering section FL and the light controlling section QL. In such an embodiment, the quantum dots QD1 and QD2 may convert a blue light L3 provided from the light emitting element LED into a green light L1 or a red light L2, or alternatively the blue light L3 may be directly provided to the display unit DP. Therefore, the display unit DP may be provided with a white light produced from a mixture of the green light L1, the red light L2, and the blue light L3.

Referring back to FIG. 1, the accommodation member HWM may be disposed below the light source unit LU, and may accommodate the display unit DP, the optical sheet OP, and the light source unit LU. The accommodation member HWM may cover the display unit DP to expose a top surface of the display unit DP. In one exemplary embodiment, for example, the accommodation member HWM may cover lateral and bottom surfaces of the display unit DP and expose an entire top surface of the display unit DP. Alternatively, the accommodation member HWM may cover a portion of the top surface of the display unit DP and also cover the lateral and bottom surfaces of the display unit DP, but the invention is not limited thereto.

Figure 4A:
FIG. 4A illustrates a plan view showing a light source unit according to an exemplary embodiment of the invention.
Figure 4B:
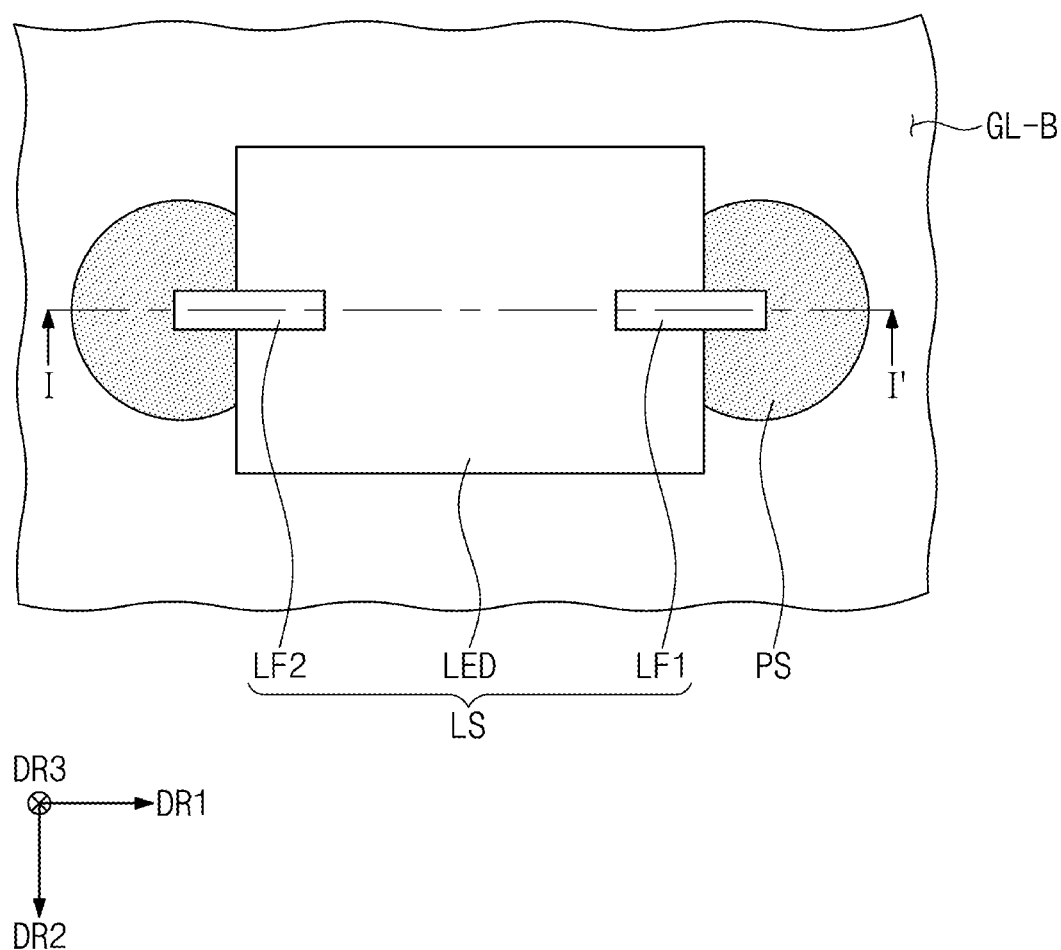
FIG. 4B illustrates an enlarged plan view showing a light source unit according to an exemplary embodiment of the invention.
Figure 4C:
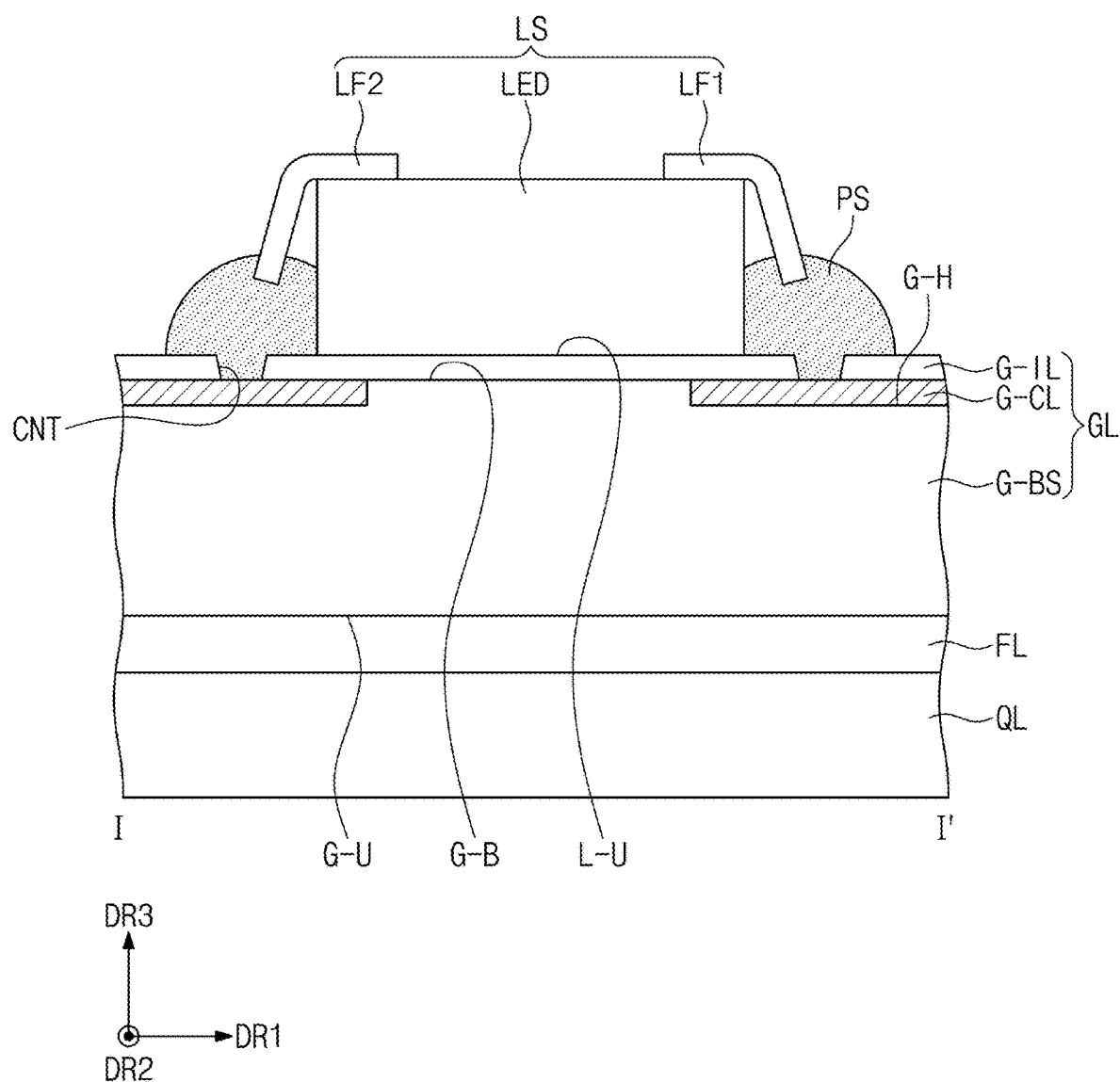
FIG. 4C illustrates a cross-sectional view taken along line I-I' of FIG. 4B.

FIG. 4A illustrates a plan view showing a light source unit according to an exemplary embodiment of the invention. FIG. 4B illustrates an enlarged plan view showing a light source unit according to an exemplary embodiment of the invention. FIG. 4C illustrates a cross-sectional view taken along line I-I' of FIG. 4B. In FIGS. 4A to 4C, the same or like components as those of FIGS. 1 to 3 are allocated the same or like reference symbols thereto, and any repetitive detailed description thereof will be omitted or simplified.

Referring to FIG. 4A, an exemplary embodiment of the light source LS according to the invention is disposed on the rear surface GL-B of the plate GL. The light source LS may be provided in plural, and the plurality of light sources LS may be arranged in a matrix shape along the first and second directions DR1 and DR2 on the rear surface GL-B of the plate GL. The light sources LS are disposed spaced apart from each other in the first and second directions DR1 and DR2.

Referring to FIGS. 4B and 4C, in an exemplary embodiment, the plate GL may include a base layer G-BS, conductive lines G-CL, and a window dielectric layer G-IL.

The base layer G-BS has a top surface G-U, on which the light scattering section FL is disposed, and a bottom surface G-B opposite to the top surface G-U. The bottom surface G-B may be defined as the rear surface (see GL-B of FIG. 3) of the plate GL. The base layer G-BS may include a glass.

The conductive lines G-CL are disposed on the bottom surface G-B of the base layer G-BS. The conductive lines G-CL may be connected to a circuit board (not shown). The conductive lines G-CL may be connected to corresponding lead frames LF1 and LF2 and may provide the light emitting element LED with voltage provided from the circuit board.

In an exemplary embodiment, the base layer G-BS includes a line groove G-H. The line groove G-H may be formed when the bottom surface G-B of the base layer G-BS is patterned along a thickness direction of the plate GL, or along the third direction DR3. The conductive lines G-CL may be disposed along the line groove G-H. Although FIG. 4C shows an exemplary embodiment in which the conductive lines G-CL are disposed in the line groove G-H to constitute a same planar surface with the bottom surface G-B of the base layer G-BS, the conductive lines G-CL may have a smaller thickness than that of the line groove G-H and thus may be mounted within the line groove G-H or may have a larger thickness than that of the line groove G-H and thus may protrude outwardly from the bottom surface G-B of the base layer G-.

The window dielectric layer G-IL covers the bottom surface G-B of the base layer G-BS. Contact holes CNT that expose at least portions of the conductive lines G-CL may be defined through the window dielectric layer G-IL. The window dielectric layer G-IL may include an inorganic material. In one exemplary embodiment, for example, the window dielectric layer G-IL may include at least one material selected from silicon oxide (SiOx), silicon nitride (SiNx), and silicon oxynitride (SiON).

In an exemplary embodiment, the conductive pastes PS may overlap corresponding contact holes CNT. The conductive pastes PS are connected through the contact holes CNT to the conductive lines G-CL. Therefore, voltage provided from a circuit board (not shown) may be transferred from the conductive lines G-CL to the light emitting element LED through the conductive pastes PS and the lead frames LF1 and LF2.

In an exemplary embodiment, light generated from the light source LS is provided through a light emitting surface L-U to the rear surface GL-B of the plate GL. The light emitting surface L-U of the light source LS is disposed on the rear surface GL-B of the plate GL. In one exemplary embodiment, for example, the light emitting surface L-U of the light source LS is disposed on the window dielectric layer G-IL and may provide the display unit DP with light.

According to exemplary embodiments of the invention, the light source LS is disposed to contact the rear surface GL-B of the plate GL without an interval between the light source LS and the plate GL, such that the electronic apparatus EA may decrease in size. In such an embodiment, the light scattering section FL and the light controlling section QL are included which are disposed on the front surface GL-U of the plate GL, such that the electronic apparatus EA may increase in color purity and optical efficiency.

Figure 5A:
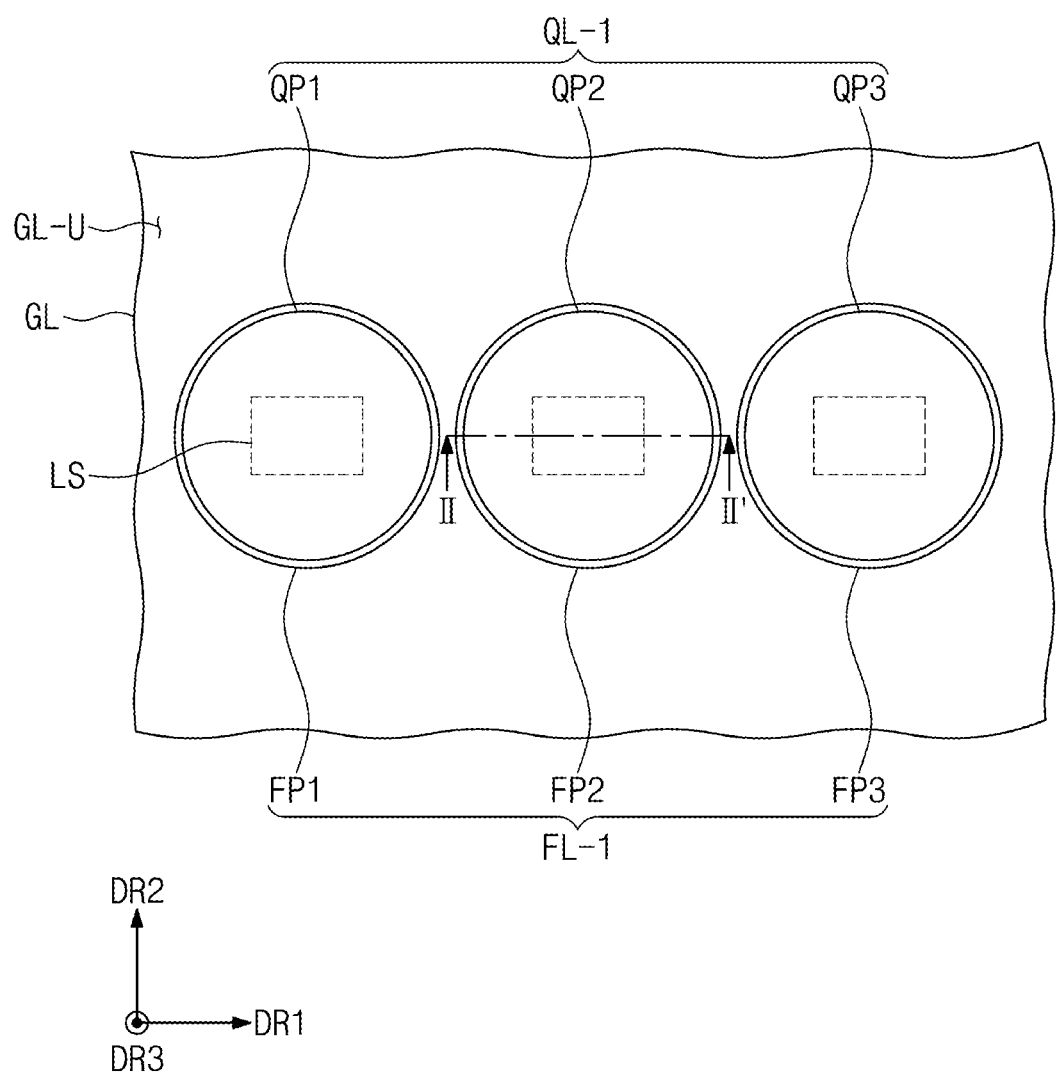
FIG. 5A illustrates a plan view showing a light source unit according to an exemplary embodiment of the invention.
Figure 5B:
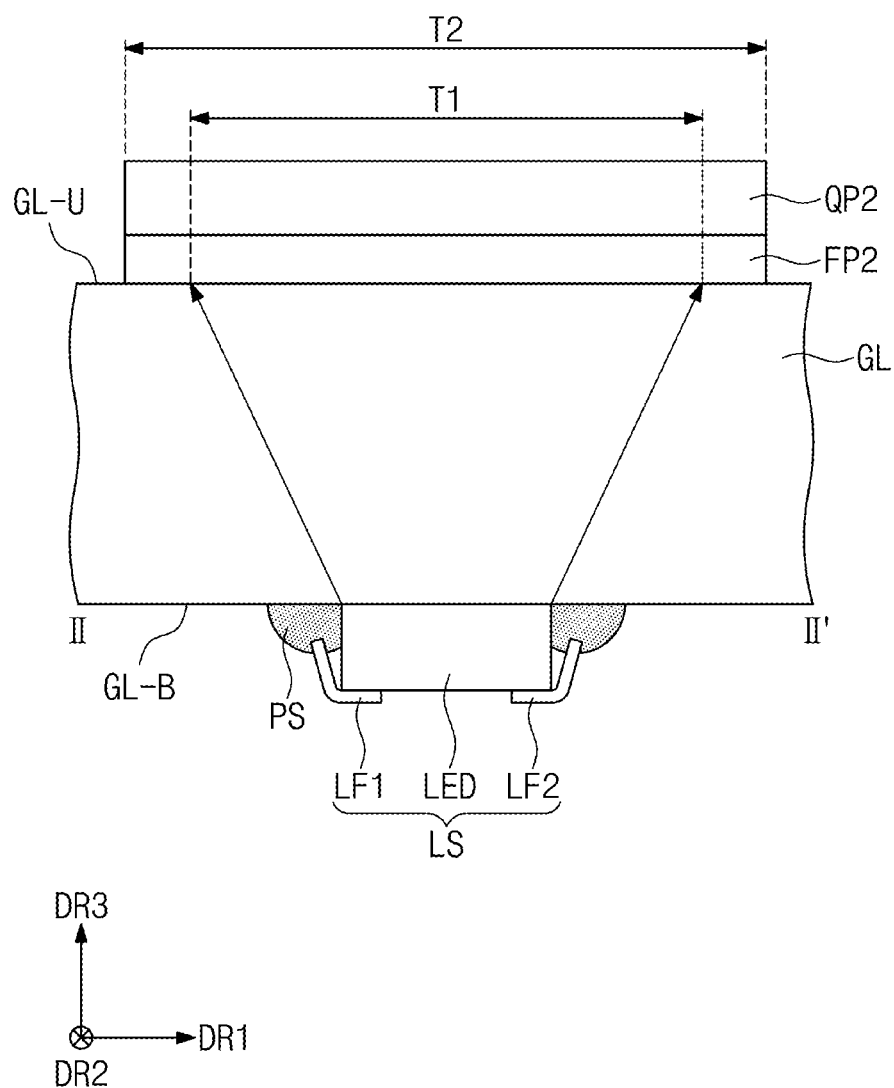
FIG. 5B illustrates a cross-sectional view taken along line II-IF of FIG. 5A.

FIG. 5A illustrates a plan view showing a light source unit according to an exemplary embodiment of the invention. FIG. 5B illustrates a cross-sectional view taken along line II-IF of FIG. 5A. In FIGS. 5A and 5B, the same or like components to those of FIGS. 1 to 4C are allocated the same or like reference symbols thereto, and any repetitive detailed description thereof will be omitted. For convenience of illustration, a dotted line is used to illustrate the light source LS disposed on the rear surface (see GL-B of FIG. 3) of the plate GL.

Referring to FIGS. 5A and 5B, in an exemplary embodiment, a light scattering section FL-1 includes a plurality of scattering patterns FP1, FP2, and FP3. The scattering patterns FP1, FP2, and FP3, when viewed in a plan view in the third direction DR3, may be disposed to overlap corresponding light sources LS, respectively. The scattering patterns FP1, FP2, and FP3 are spaced apart from each other when viewed in the plan view.

A light controlling section QL-1 includes a plurality of controlling patterns QP1, QP2, and QP3. The controlling patterns QP1, QP2, and QP3, when viewed in the plan, may be disposed to overlap corresponding light source LS, respectively. Therefore, the controlling patterns QP1, QP2, and QP3 may respectively overlap the scattering patterns FP1, FP2, and FP3. In one exemplary embodiment, for example, a first scattering pattern FP1 overlaps a first controlling pattern QP1, and a second scattering pattern FP2 overlaps a second controlling pattern QP2. In such an embodiment, a third scattering pattern FP3 may be disposed overlapping a third controlling pattern QP3. The controlling patterns QP1, QP2, and QP3 are spaced apart from each other when viewed in the plan view.

FIG. 5A shows an exemplary embodiment with three scattering patterns FP1, FP2, and FP3 arranged in the first direction DR1 and three controlling patterns QP1, QP2, and QP3 arranged in the first direction DR1.

Light provided from a light source LS is irradiated to the front surface GL-U of the plate GL. In such an embodiment, light irradiated from one light source LS to the front surface GL-U of the plate GL has a first width T1, or a maximum width in the first direction DR1.

The second scattering pattern FP2 and the second controlling pattern QP2 that are disposed on or corresponding to the light source LS has a second width T2 in the first direction DR1.

In an exemplary embodiment, the second width T2 may be greater than the first width T1. FIG. 5B shows an exemplary embodiment where the second scattering pattern FP2 and the second controlling pattern QP2 have a same width as each other or the second width T2, but not being limited thereto. Alternatively, the second scattering pattern FP2 and the second controlling pattern QP2 may have different widths from each other as long as each of the second scattering pattern FP2 and the second controlling pattern QP2 has a width greater than the first width T1 of light irradiated to the front surface GL-U of the plate GL.

Figure 6:
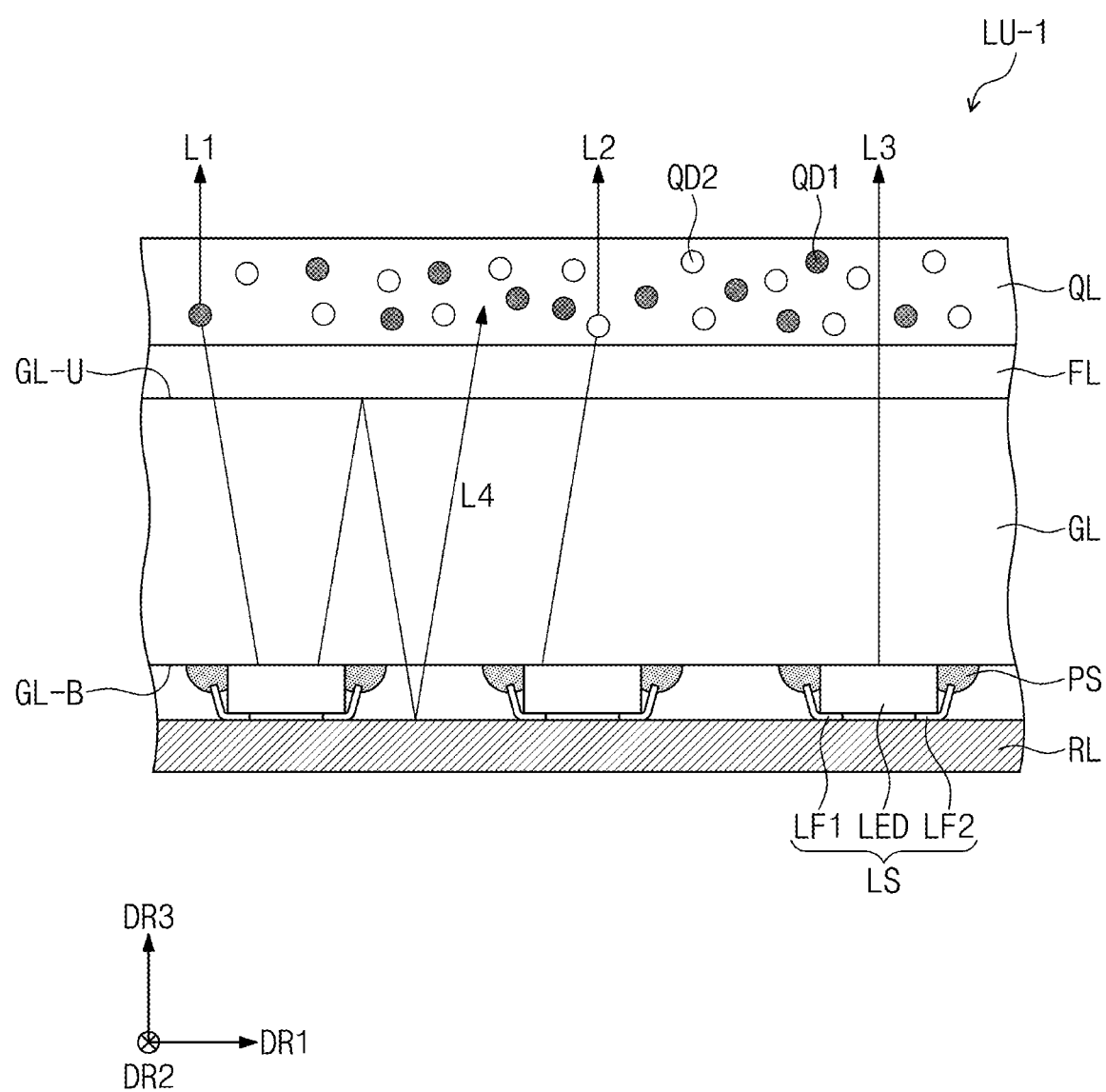
FIG. 6 illustrates a cross-sectional view showing a light source unit according to an exemplary embodiment of the invention.

FIG. 6 illustrates a cross-sectional view showing a light source unit according to an exemplary embodiment of the invention. In FIG. 6, the same or like components to those of FIGS. 1 to 4C are allocated the same or like reference symbols thereto, and any repetitive detailed description thereof will be omitted.

In an exemplary embodiment, as shown in FIG. 6, a light source unit LU-1 may include a plate GL, a light scattering section FL, a light controlling section QL, and a light source LS. In such an embodiment, the light source unit LU-1 may further include a light reflecting section RL. The plate GL, the light scattering section FL, the light controlling section QL, and the light source LS of the light source unit LU-1 may be substantially the same as the plate GL, the light scattering section FL, the light controlling section QL, and the light source LS of the light source unit LU described above with reference to FIG. 3.

In an exemplary embodiment, the light reflecting section RL may be disposed spaced apart from the rear surface GL-B of the plate GL across the light source LS. The light reflecting section RL may be disposed below the light source LS, and may serve to reflect a light L4, which is leaked from the plate GL, to travel toward the light controlling section QL. The light reflecting section RL may not be limited in material as long as the material is capable of reflecting light, and may be provided as a single layer or a multiple layer.

According to an exemplary embodiment, the light reflecting section RL is included to cause the leaked light L4 to travel toward the light controlling section QL, such that the light source unit LU-1 may increase in optical efficiency.

Figure 7:
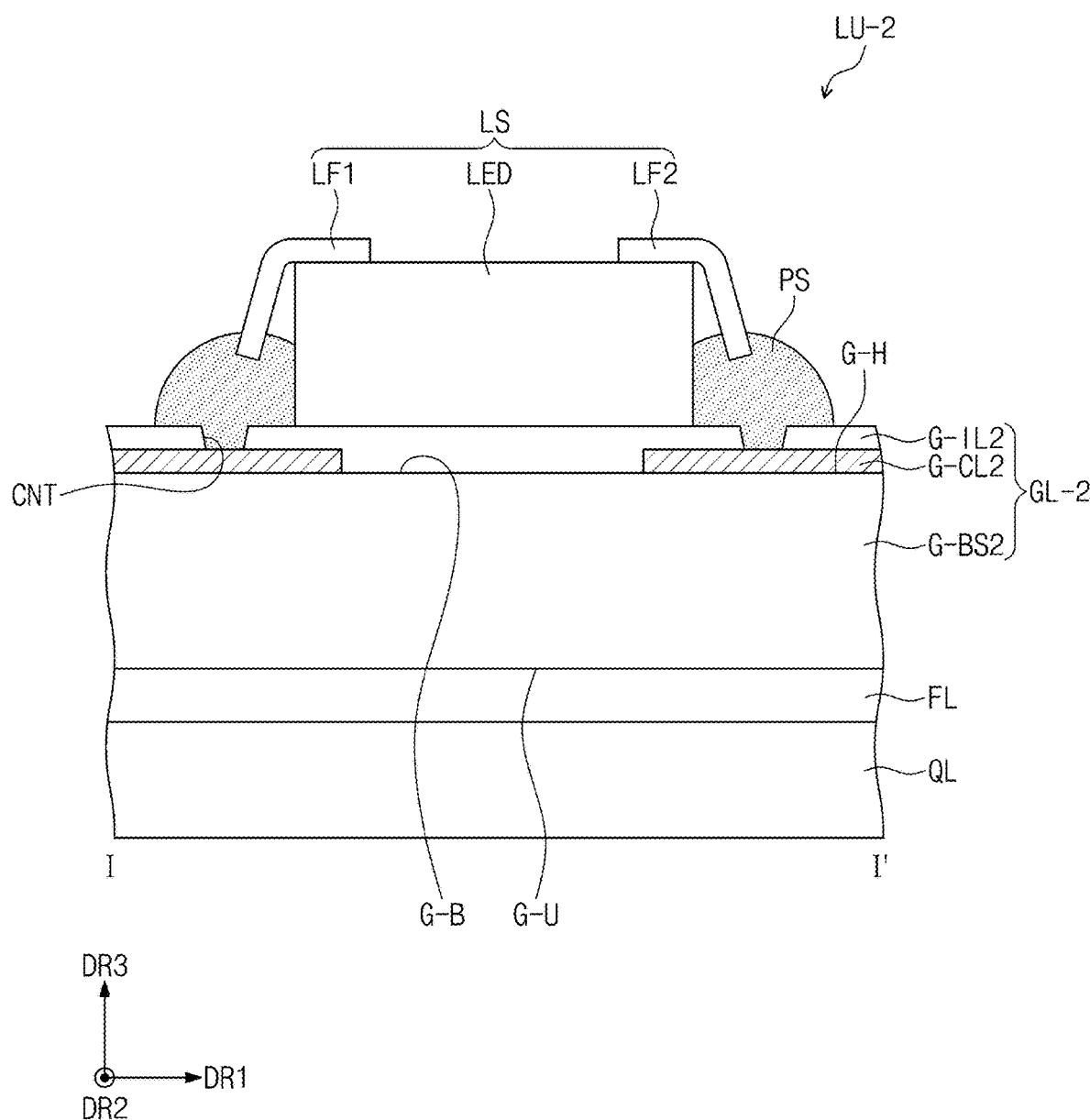
FIG. 7 illustrates a cross-sectional view showing a light source unit according to an exemplary embodiment of the invention.

FIG. 7 illustrates a cross-sectional view showing a light source unit according to an exemplary embodiment of the invention. In FIG. 7, the same or like components to those of FIGS. 1 to 4C are allocated the same or like reference symbols thereto, and any repetitive detailed description thereof will be omitted.

In an exemplary embodiment, as shown in FIG. 7, a light source unit LU-2 may include a plate GL-2, a light scattering section FL, a light controlling section QL, and a light source LS. The scattering section FL, the light controlling section QL, and the light source LS of the light source unit LU-2 may be substantially the same as the light scattering section FL, the light controlling section QL, and the light source LS of the light source unit LU described above with reference to FIG. 4C.

In an exemplary embodiment, the plate GL-2 may include a base layer G-B52, conductive lines G-CL2, and a window dielectric layer G-IL2.

In such an embodiment, the base layer G-BS2 includes a top surface G-U on which the light scattering section FL is disposed and a bottom surface G-B opposite to the top surface G-U. The bottom surface G-B may be defined as a rear surface (see GL-B of FIG. 3) of the plate GL-2. The base layer G-B52 may include a glass.

The conductive lines G-CL2 are disposed on the bottom surface G-B of the base layer G-BS2. In an exemplary embodiment, as shown in FIG. 7, the conductive lines G-CL2 are disposed directly on the bottom surface G-B of the base layer G-BS2.

One of the conductive lines G-CL2 that is connected to the first lead frame LF1 is disposed spaced apart from other one of the conductive lines G-CL2 that is connected to the second lead frame LF2.

The window dielectric layer G-IL2 covers the conductive lines G-CL2 and the bottom surface G-B of the base layer G-BS2. The window dielectric layer G-IL2 may be disposed on in a space between the conductive lines G-CL2 connected to the lead frames LF1 and LF2 different from each other.

Contact holes CNT that expose at least portions of the conductive lines G-CL2 are defined through the window dielectric layer G-IL2. The conductive pastes PS are connected through the contact holes CNT to the conductive lines G-CL2.

According to an exemplary embodiment, the conductive lines G-CL2 are disposed or formed on the base layer G-BS2 without separately performing a patterning process on the base layer G-BS2, such that the light source unit LU-2 may decrease in manufacturing cost and time.

FIGS. 8A to 8I illustrate cross-sectional views showing a method of fabricating an electronic apparatus according to an exemplary embodiment of the invention. In FIGS. 8A to 8I, the same or like components to those of FIGS. 1 to 4C are allocated the same or similar reference symbols thereto, and any repetitive detailed description thereof will be omitted.

Figure 8A:
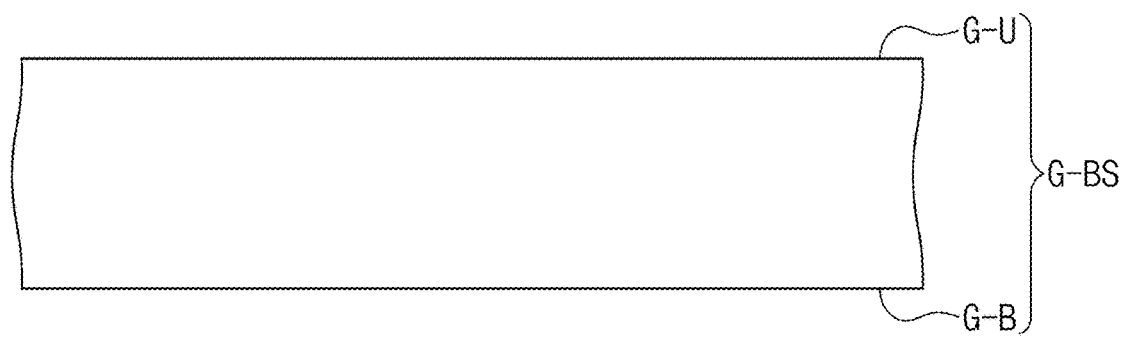
FIGS. 8A to 8I illustrate cross-sectional views showing a method of fabricating an electronic apparatus according to an exemplary embodiment of the invention.
Figure 8A:
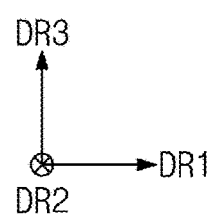
Figure 8B:
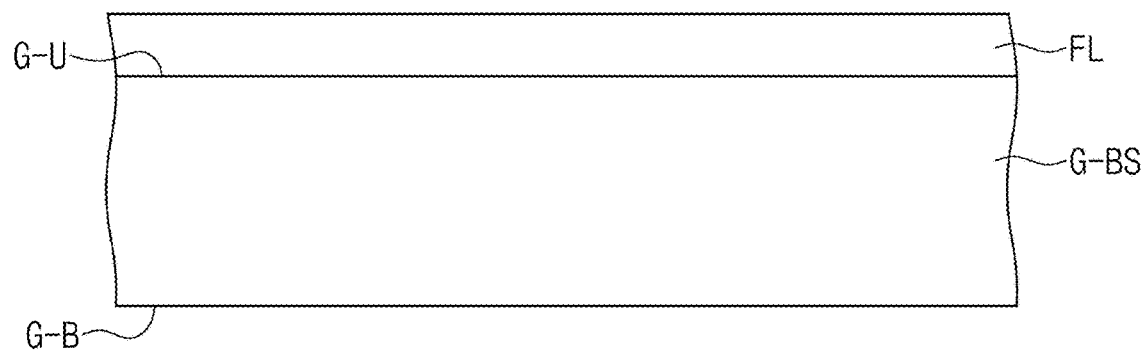
Figure 8B:
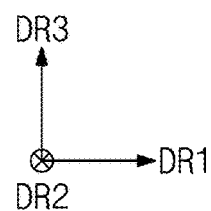
Figure 8C:
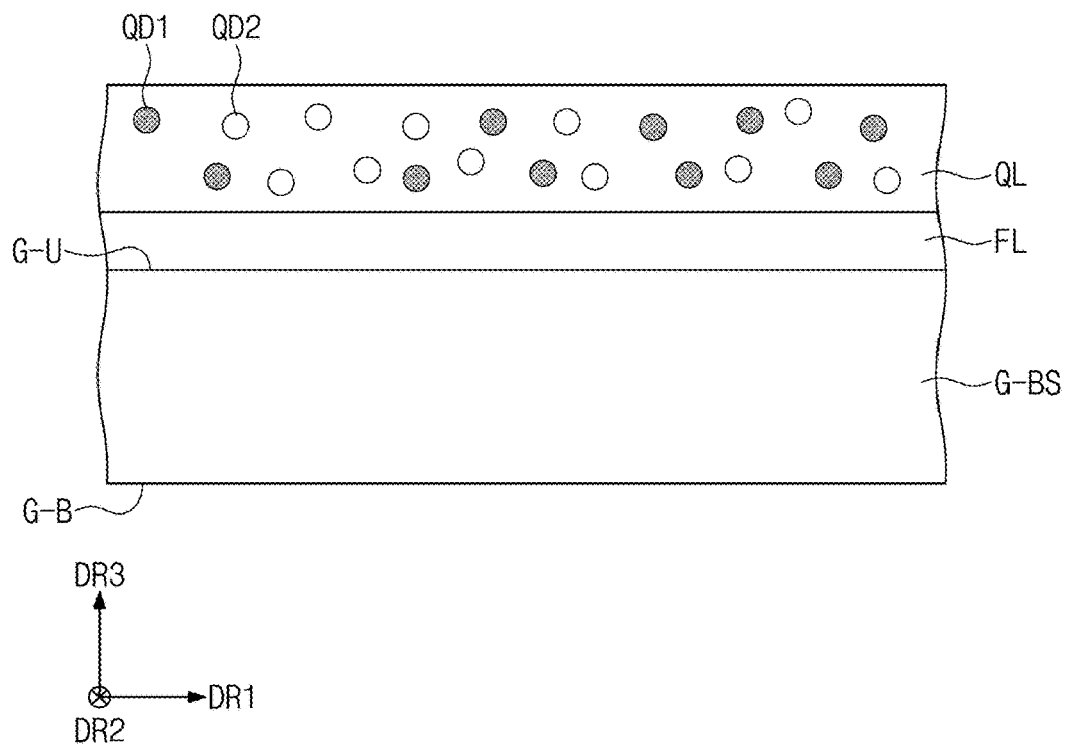

Referring to FIGS. 8A to 8C, an exemplary embodiment of a method of fabricating a light source unit includes providing a preliminary plate.

The providing of the preliminary plate may include preparing a base layer G-BSA, forming a light scattering section FL on the base layer G-BSA, and forming a light controlling section QL on the light scattering section FL. The base layer G-BSA has a top surface G-U and a bottom surface G-B opposite to each other. The light scattering section FL is deposited on the top surface G-U of the base layer G-BSA. Afterwards, the light controlling section QL including quantum dots QD1 and QD2 is deposited on the light scattering section FL. Therefore, the preliminary plate may be formed as shown in FIG. 8C.

FIGS. 8A to 8C show an exemplary embodiment where the light scattering section FL and the light controlling section QL are entirely deposited on the top surface G-U of the base layer G-BSA, but not being limited thereto. Alternatively, at least one mask may be separately used to form the light scattering section FL that includes scattering patterns (see FP1, FP2, and FP3 of FIG. 5A) spaced apart from each other and also to form the light controlling section QL that includes controlling patterns (see QP1, QP2, and QP3 of FIG. 5A) deposited on corresponding scattering patterns (see FP1, FP2, and FP3 of FIG. 5A), respectively.

Figure 8D:
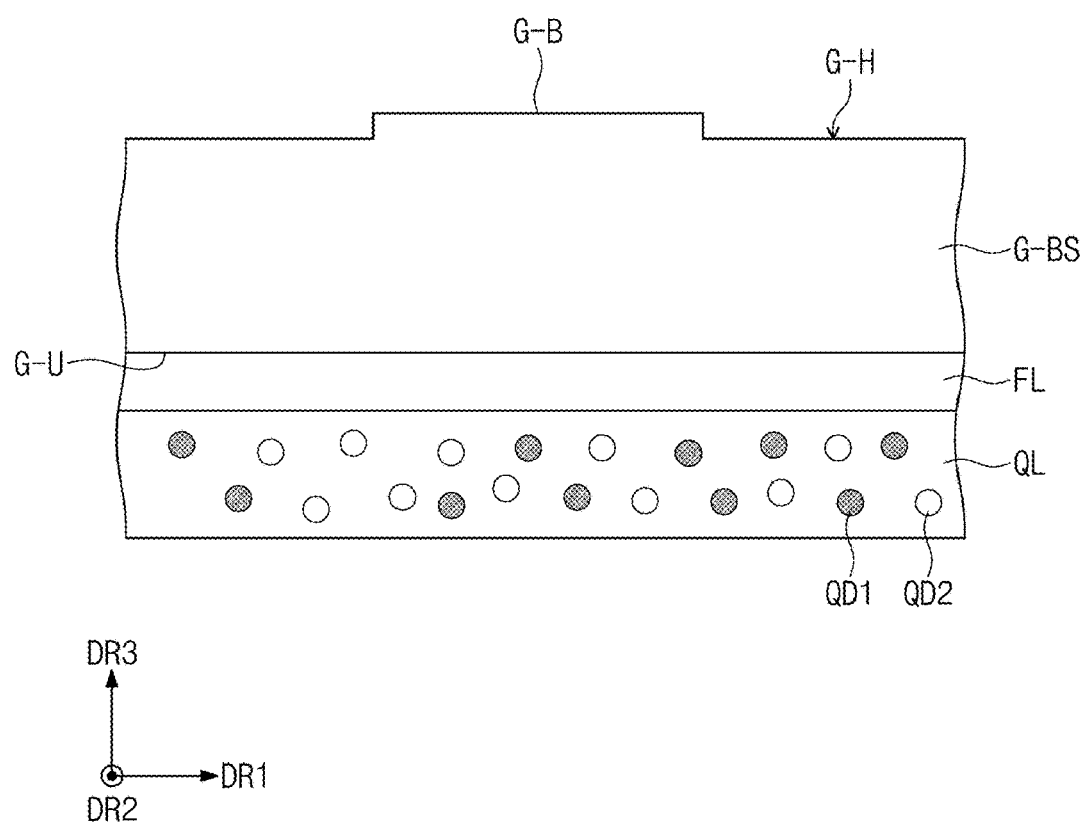

In an exemplary embodiment, referring to FIG. 8D, the method of fabricating a light source unit includes forming a line groove G-H.

The line groove G-H may be formed when the bottom surface G-B of the base layer G-BS is patterned along a thickness direction of the base layer G-BS.

Figure 8E:
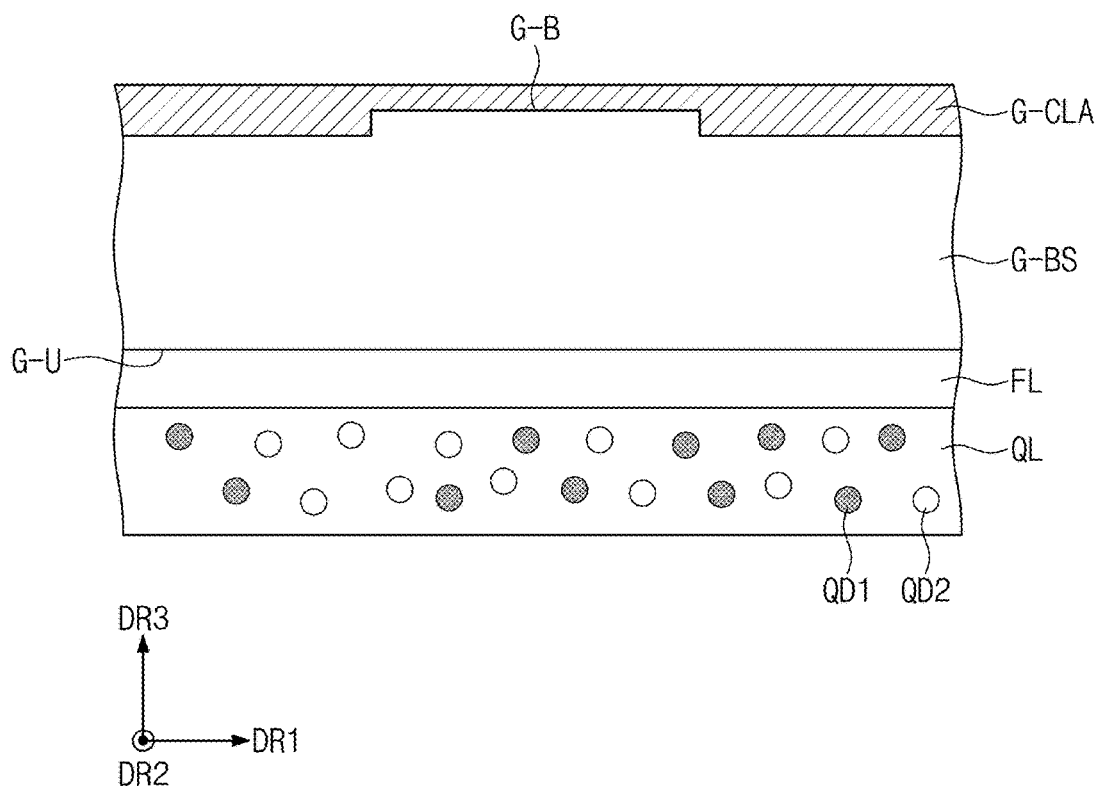
Figure 8F:
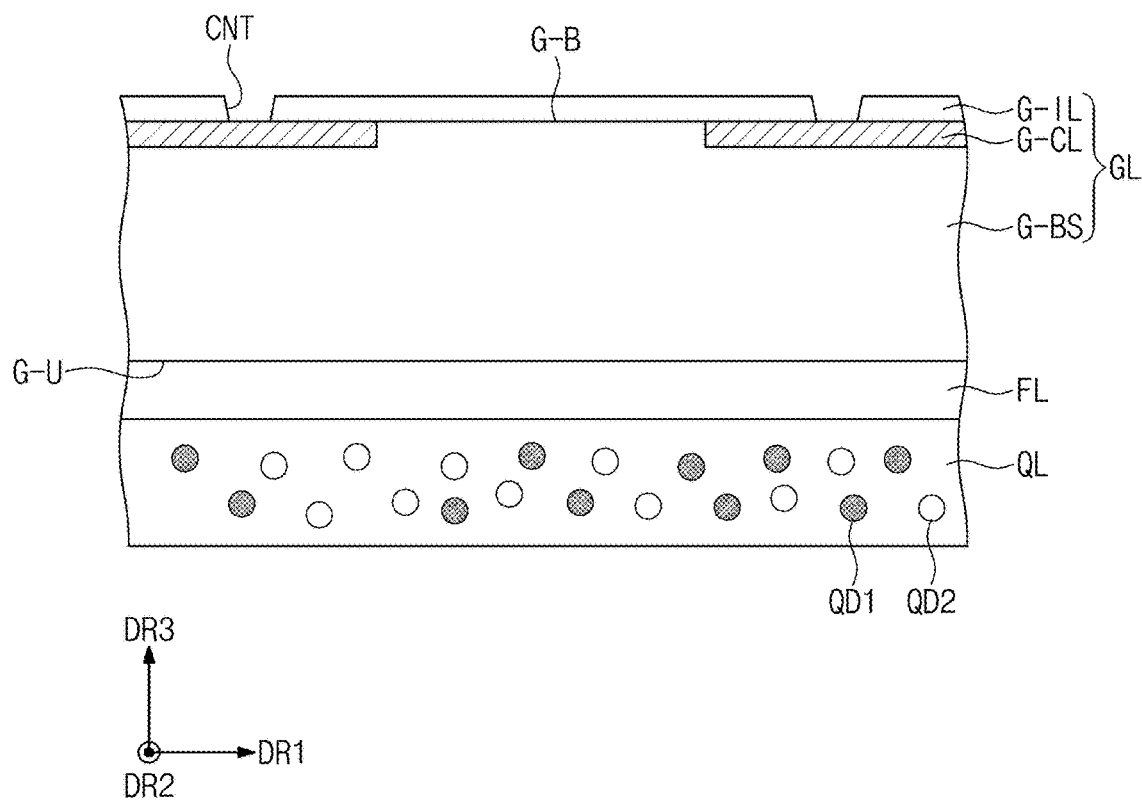

Thereafter, referring to FIGS. 8E and 8F, the method of fabricating a light source unit may include forming conductive lines G-CL.

The conductive lines G-CL may be formed by coating a conductive material G-CLA on the bottom surface G-B of the base layer G-BS on which the line groove G-H is formed, and then patterning the conductive material G-CLA to externally expose the bottom surface G-B.

Thereafter, the formation of a window dielectric layer G-IL may be performed. The window dielectric layer G-IL may be formed by coating an inorganic material on the bottom surface G-B of the base layer G-BS, and then by forming contact holes CNT through the inorganic material to expose portions of the conductive lines G-CL. The preliminary plate of FIG. 8C may thus be formed into a plate GL that includes the base layer G-BS, the conductive lines G-CL, and the window dielectric layer G-IL.

Figure 8G:
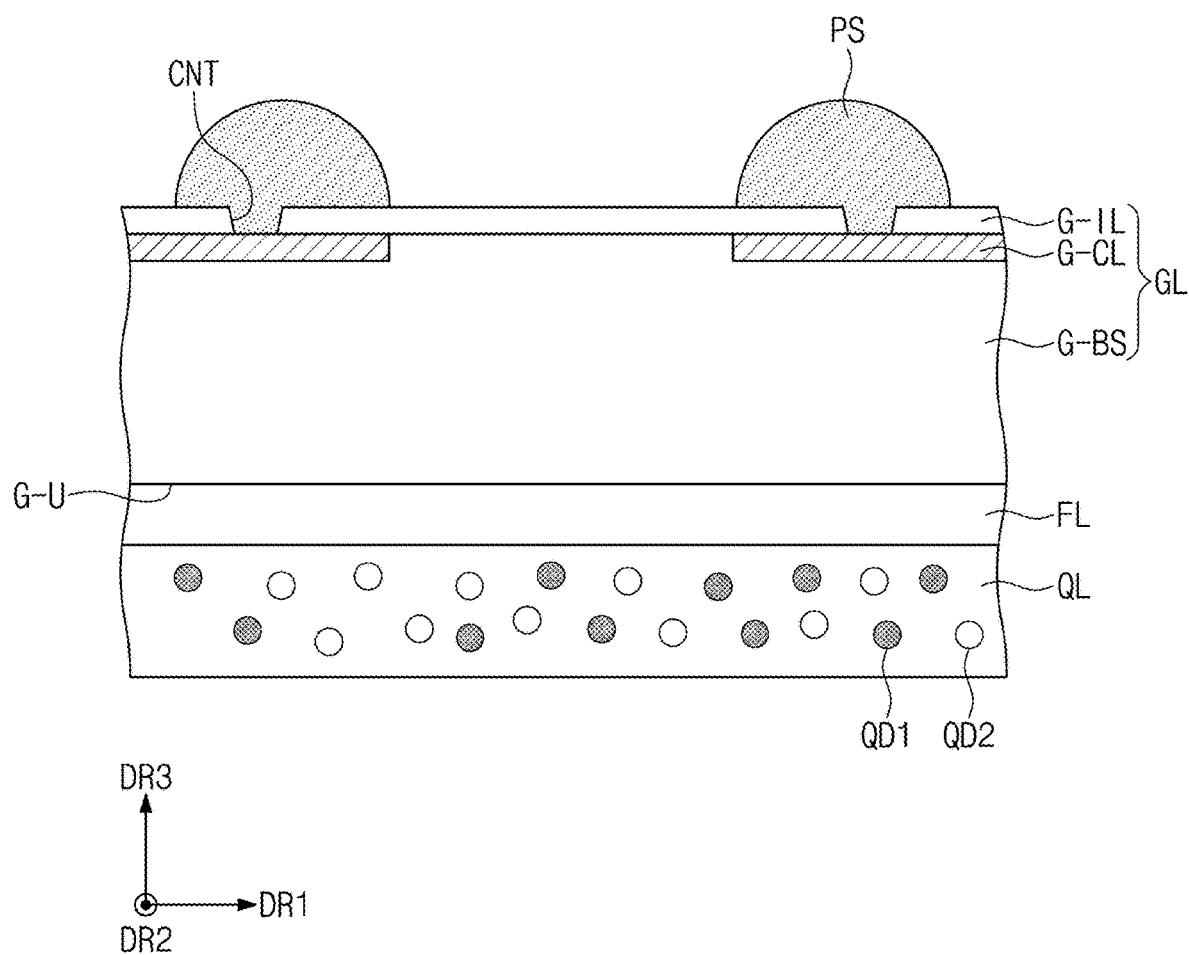

In such an embodiment, referring to FIG. 8G, the method of fabricating a light source unit may include forming conductive pastes PS.

The conductive pastes PS may be formed by coating a paste that includes a conductive material to overlap the contact holes CNT.

Figure 8H:
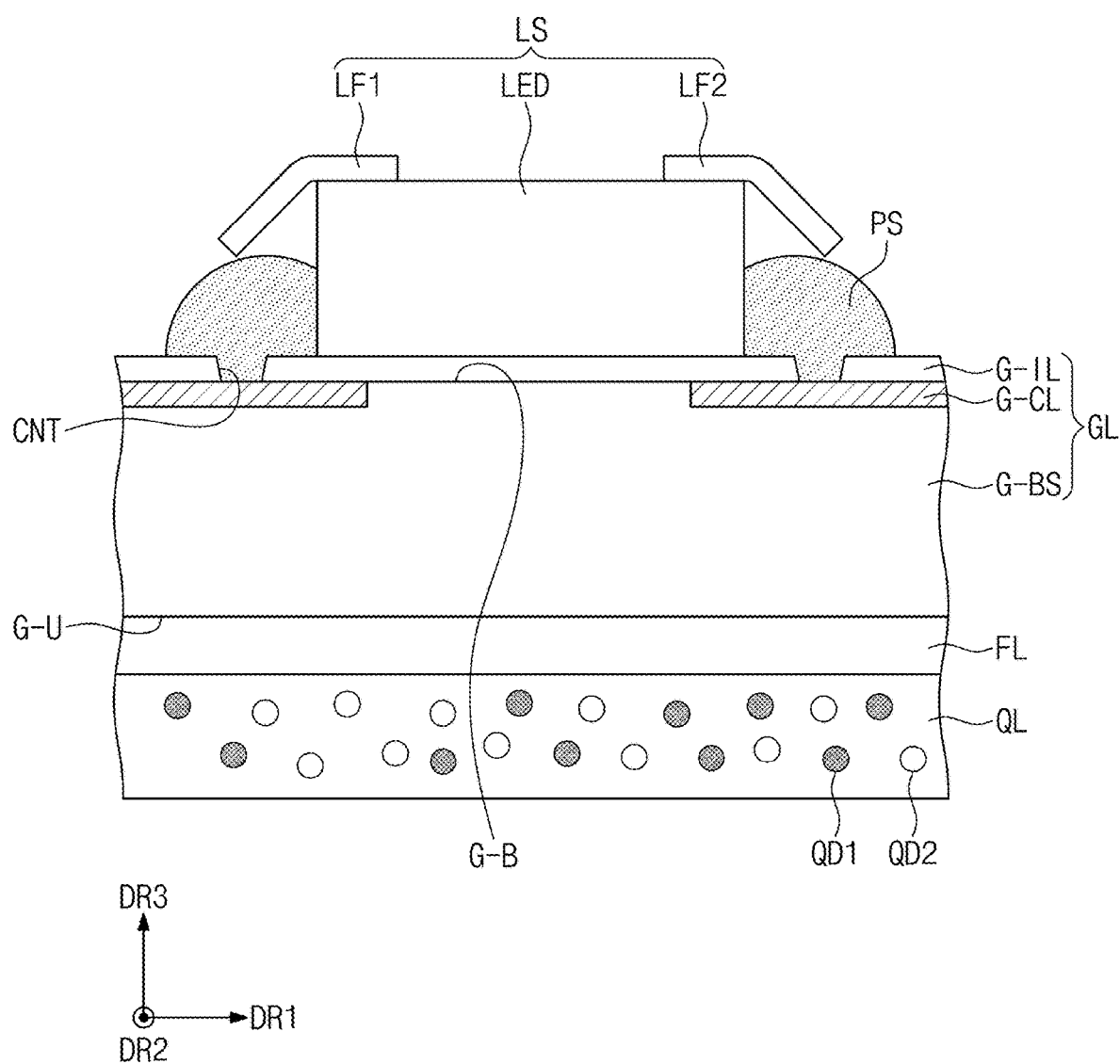

In such an embodiment, referring to FIG. 8H, the method of fabricating a light source unit may include providing a light source LS.

The light source LS is disposed directly on the window dielectric layer G-IL. Lead frames LF1 and LF2 of the light source LS may protrude from a light emitting element LED and may overlap the conductive pastes PS.

Figure 8I:
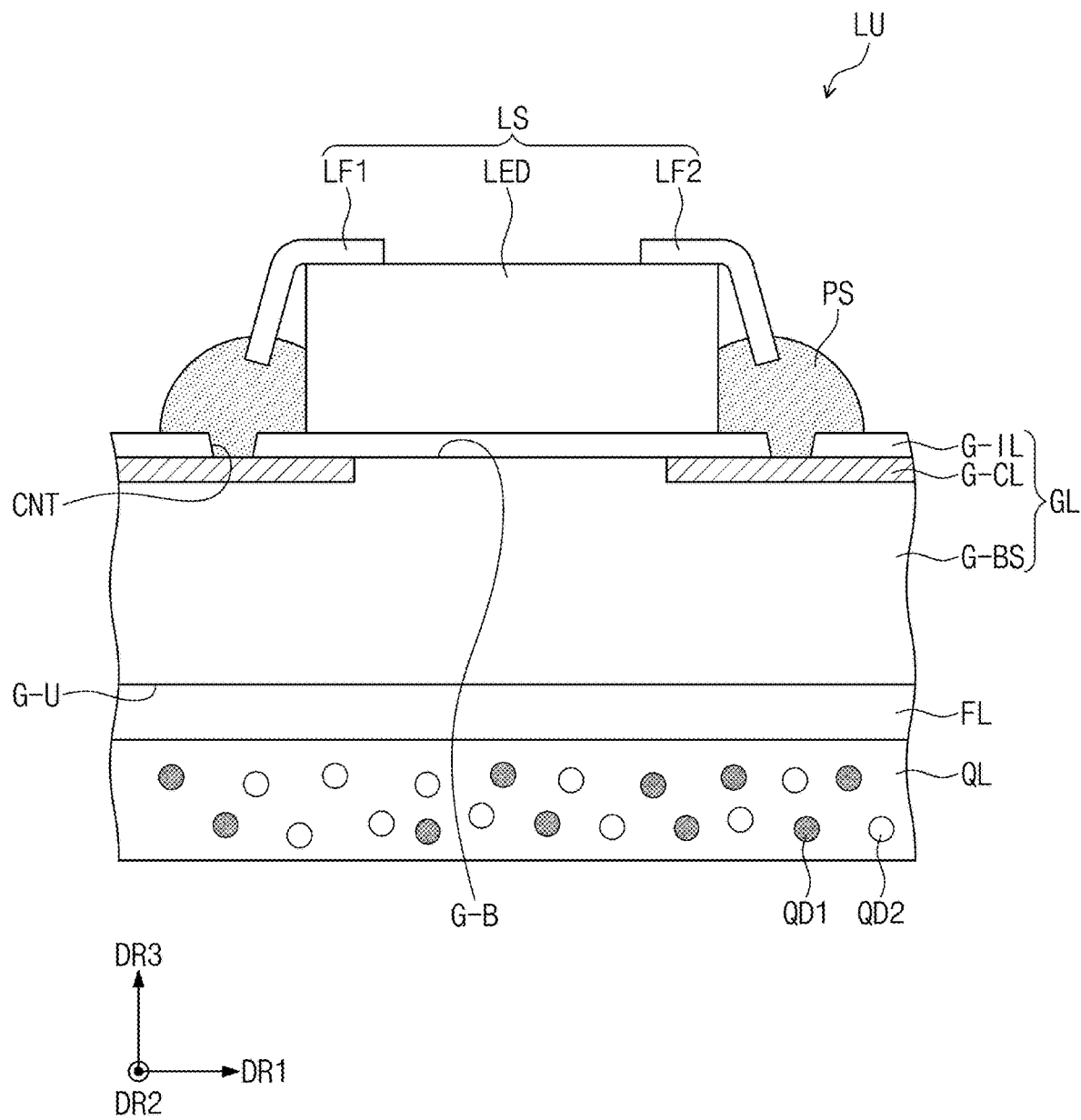

In such an embodiment, referring to FIG. 8I, the method of fabricating a light source unit may further include heating the conductive pastes PS and then solidifying the conductive pastes PS that are melted or in a molten state.

The lead frames LF1 and LF2 may be introduced into the conductive pastes PS in a heated state, and the melted conductive pastes PS may be solidified to allow the lead frames LF1 and LF2 to have electrical connection with the conductive lines G-CL that are exposed from the contact holes CNT.

According to exemplary embodiments of the invention, the light source LS is disposed to contact the bottom surface G-B of the base layer G-BS without an interval between the light source LS and the plate GL, such that it may be possible to provide a small-sized electrode apparatus (see EA of FIG. 1). In such embodiments, the light scattering section FL and the light controlling section QL are included to be disposed on a front surface GL-U of the plate GL, or on the top surface G-U of the base layer G-BS, such that the electronic apparatus EA may have improved color purity and optical efficiency.

The invention should not be construed as being limited to the exemplary embodiments set forth herein. Rather, these exemplary embodiments are provided so that this disclosure will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. A light source unit, comprising:
    a plate including a front surface and a rear surface opposite to the front surface;
    a light scattering section on the front surface of the plate;
    a light controlling section on the light scattering section, wherein the light controlling section includes a plurality of quantum dots;
    a light source on the rear surface of the plate, wherein the light source includes a light emitting element which generates light, a light emitting surface from which the light is emitted, and a plurality of lead frames connected to the light emitting element,
wherein the light source provides light from the rear surface of the plate toward the light controlling section, and
wherein the light emitting surface of the light source is in contact with the rear surface of the plate.

2. The light source unit of claim 1, wherein the plate includes:
a base layer including a top surface, on which the light scattering section is disposed, and a bottom surface opposite to the top surface;
a plurality of conductive lines on the bottom surface of the base layer; and
a window dielectric layer which covers the bottom surface of the base layer, wherein a plurality of contact holes is defined through the window dielectric layer to expose portions of the conductive lines,
wherein each of the lead frames is connected to a corresponding one of the conductive lines.

3. The light source unit of claim 2, further comprising:
a plurality of conductive pastes on the window dielectric layer, wherein the conductive pastes overlap the contact holes, respectively,
wherein the lead frames are connected to the conductive lines through the conductive pastes.

4. The light source unit of claim 2, wherein
the base layer includes a line groove patterned on the bottom surface of the base layer in a thickness direction of the plate, and
the conductive lines are disposed in the line groove.

5. The light source unit of claim 1, wherein
the light source is provided in plural,
the light scattering section includes a plurality of scattering patterns which overlaps the plurality of light sources, respectively, when viewed in a plan view, and
the light controlling section further includes a plurality of controlling patterns which overlap the scattering patterns, respectively, when viewed in the plan view.

6. The light source unit of claim 5, wherein a width of each of the controlling patterns is greater than a maximum width of light irradiated to the front surface of the plate from a corresponding one of the light sources.

7. The light source unit of claim 1, wherein the light provided from the light source toward the light controlling section is a blue light.

8. The light source unit of claim 7, wherein the quantum dots of the light controlling section convert the light provided from the light source into one of a red light and a green light.

9. The light source unit of claim 1, further comprising:
a light reflecting section spaced apart from the rear surface of the plate over the light source.

10. An electronic apparatus, comprising:
a light source unit including:
a plate including a front surface and a rear surface opposite to the front surface;
a light scattering section on the front surface of the plate;
a light controlling section on the light scattering section; and
a light source on the rear surface of the plate, wherein the light controlling section includes a plurality of quantum dots;
a display unit on the light source unit, wherein the display unit includes a first substrate, a second substrate opposite to the first substrate, and a liquid crystal layer between the first substrate and the second substrate; and
an optical sheet between the display unit and the light source unit,
wherein the light source provides the display unit with light and contacts the rear surface of the plate.

11. The electronic apparatus of claim 10, wherein the plate includes:
a base layer including a top surface, on which the light scattering section is disposed, and a bottom surface opposite to the top surface;
a plurality of conductive lines on the bottom surface of the base layer; and
a window dielectric layer which covers the bottom surface of the base layer, wherein a plurality of contact holes is defined through the window dielectric layer to expose portions of the conductive lines.

12. The electronic apparatus of claim 11, wherein
the light source includes a light emitting element which generates light, and a plurality of lead frames connected to the light emitting element,
wherein each of the lead frames is connected to a corresponding one of the conductive lines.

13. The electronic apparatus of claim 12, wherein
the light source unit further includes a plurality of conductive pastes on the window dielectric layer, wherein the conductive pastes overlap the contact holes, respectively, and
the lead frames are connected to the conductive lines through the conductive pastes.

14. The electronic apparatus of claim 11, wherein
the base layer includes a line groove patterned on the bottom surface of the base layer in a thickness direction of the plate, and
the conductive lines are disposed in the line groove.

15. The electronic apparatus of claim 10, wherein
the light source is provided in plural,
the light scattering section includes a plurality of scattering patterns which overlap a plurality of light sources, respectively, when viewed in a plan view, and
the light controlling section further includes a plurality of controlling patterns which overlaps the scattering patterns, respectively, when viewed in the plan view.

16. The electronic apparatus of claim 15, wherein a width of each of the controlling patterns is greater than a maximum width of light irradiated to the front surface of the plate from a corresponding one of the light sources.

17. The electronic apparatus of claim 10, wherein
the first substrate includes a first base substrate, a transistor on the first base substrate, a first electrode connected to the transistor, a color filter layer between the transistor and the first electrode, and a first polarizing layer below the first base substrate, and
the second substrate includes a second base substrate, a second electrode on the second base substrate, and a second polarizing layer on the second base substrate.

18. The electronic apparatus of claim 10, wherein the optical sheet includes at least one sheet selected from a diffusion sheet, a prism sheet, and a brightness enhancement sheet.

19. A method of fabricating a light source unit, the method comprising:
providing a preliminary plate which includes a base layer including a top surface and a bottom surface opposite to each other, a light scattering section on the top surface of the base layer, and a light controlling section on the light scattering section;

patterning the bottom surface of the base layer to form a line groove, wherein the bottom surface is patterned in a thickness direction of the base layer;

providing a plurality of conductive lines in the line groove;

providing a window dielectric layer on the conductive lines, and forming a plurality of contact holes through the window dielectric layer to expose at least portions of the conductive lines;

providing a plurality of conductive pastes which overlaps the contact holes, respectively; and providing a light source connected to the conductive lines through the conductive pastes, wherein the light source is in contact with the window dielectric layer.

20. The method of claim 19, further comprising:

heating the conductive pastes; and solidifying the conductive pastes which are in a molten state.

\* \* \* \* \*